United States Patent [19]

Connell

[11] Patent Number: 4,996,529
[45] Date of Patent: Feb. 26, 1991

[54] AUTO-ZEROING CIRCUIT FOR OFFSET CANCELLATION

[75] Inventor: Lawrence E. Connell, Naperville, Ill.
[73] Assignee: Motorola, Inc., Schaumburg, Ill.
[21] Appl. No.: 335,628
[22] Filed: Apr. 10, 1989
[51] Int. Cl.$^5$ .............................................. H03M 1/06
[52] U.S. Cl. ..................................... 341/118; 307/359
[58] Field of Search .................. 341/118, 155; 375/76; 307/359

[56] References Cited

U.S. PATENT DOCUMENTS

| | | | |
|---|---|---|---|
| 4,097,860 | 6/1978 | Araseki et al. | 307/359 |
| 4,302,845 | 11/1981 | McClaughry | 375/82 |
| 4,574,271 | 3/1986 | Yada | 341/118 |
| 4,625,320 | 11/1986 | Butcher | 375/76 |
| 4,739,305 | 4/1988 | Naito | 341/118 |

OTHER PUBLICATIONS

Candy, J. C., "A Use of Double Integration in Sigma Delta Modulation", *IEEE Transactions on Communications* vol. COM-33, No. 3, (Mar. 1985), pp. 249-258.
Candy, J. C. et al., "A Per-Channel A/D Converter Having 15-Segment μ-255 Companding", *IEEE Transactions on Communications*, vol. COM-24, No. 1 (Jan. 1976), pp. 33-42.
Candy, J. C. and B. A. Wooley, "Precise Biasing of Analog-to-Digital Converters by Means of Auto-Zero Feedback", *IEEE Journal of Solid State Circuits*, vol. SC-17, No. 6 (Dec. 1982), pp. 1220-1225.
Gregorian R. et al., "An Integrated Single-Chip PCM Voice CODEC with Filters", *IEEE Journal of Solid State Circuits*, vol. S.C-16, No. 4, (Aug. 1981), pp. 322-333.
Iwata, Atsushi et al., "A Single-Chip CODEC with Switched-Capacitor Filters", *IEEE Journal of Solid-State Circuits*, vol. SC-16, No. 4, Aug. 1981, pp. 315-321.
Matsuya, Y. et al., "A 16-Bit Oversampling A-to-D Conversion Technology Using Triple-Integration Noise Shaping", *IEEE Transactions on Communications*, SC-22, No. 6 (Dec. 1987), pp. 921-929.
Yamakido, K. et al., "A Single-Chip CMOS Filter/CODEC", *IEEE Journal of Solid State Circuits*, vol. SC-16, No. 4, (Aug. 1981), pp. 302-307.

*Primary Examiner*—William M. Shoop, Jr.
*Assistant Examiner*—Marc S. Hoff
*Attorney, Agent, or Firm*—Phillip H. Melamed

[57] ABSTRACT

An improved auto-zeroing feedback control circuit (FIG. 1) is disclosed to compensate for DC offset voltages in signal coding applications. The feedback control circuit for a signal limiter (120) includes a digital integrator (130) which oversamples the limited output (125). When the accumulated sample count overflows, an analog integrator (140) is enabled, and a small quantity of charge is delivered to the integrating capacitor. The analog integrator output signal (145) is then attenuated (150) and used to adjust the bias for the limiter (120). This improved auto-zeroing technique eliminates the requirement of a large external auto-zero capacitor, and permits the signal coder to be fully integrated on-chip.

36 Claims, 4 Drawing Sheets

AUTO-ZEROING CIRCUIT FOR OFFSET CANCELLATION

BACKGROUND OF THE INVENTION

This invention generally relates to the field of DC biasing techniques for analog-to-digital A/D converter circuits. More specifically, the present invention provides an improved circuit configuration based upon a well-known auto-zeroing technique, which is designed to compensate for DC offset voltages of various circuit components. The invention is particularly adapted for use in A/D converters, zero-crossing detectors, and signal limiters.

Recently there has been an increased demand for further reduction in the size, cost, and complexity of electronic circuits used for transmission of analog voice, digital voice, and highspeed data over various types of communication channels. This increased demand has resulted in significant improvements in the development of integrated circuits for A/D conversion of the analog voice signals for digital coding. For example, a single-chip monolithic compressed/expanded (companded) pulse-code modulation (PCM) coder/decoder (CODEC) utilizing silicon-gate CMOS process technology is described by R. Gregorian et al. in the article entitled "An Integrated Single-Chip PCM Voice CODEC with Filters", *IEEE Journal of Solid State Circuits*, Vol. SC-16, No. 4; (Aug. 1981), pp. 322–33.

It is known that the DC biasing of an A/D converter directly influences the output code generated when the A/D input is idle. For companded PCM encoders, the quantization levels are nonuniformly spaced and the finest resolution is only available over a small portion of the signal range. Therefore, to correctly encode small signals, it is necessary to precisely control the input bias voltage of the A/D such that small signals are centered within this range. For signal limiters, the DC biasing at the limiter input affects the duty cycle of the output waveform. When signal limiters are used to demodulate data, it is essential to preserve the duty cycle or zero-crossings of the input waveform. To ensure that small input signals are correctly demodulated, the DC bias of the limiter must be precisely controlled to remove offset voltage errors. Offset voltages can arise from many different sources, i.e., the limiter stage itself, any preceding receive filter stages, etc.

One well-known approach for precisely biasing limiters or A/D converters involves a technique commonly referred to as "auto-zeroing". In using this approach, the hard-limited signal available at the output of a limiter (or available as one or more bits of the A/D's output, i.e., the sign bit) is integrated or averaged, and negatively fed back to the input of the limiter (or a preceding filter stage) to negate inherent offsets (and any accumulated offset from commonly used prefilters). A simple high-pass filter is typically used to remove large accumulated offsets. However, if the prefilter offset is relatively small, the high-pass filter can be omitted. The effect of the auto-zero feedback loop is to provide an automatic adjustment of the limiter stage or filter stage for cancelling DC offset voltages. A further explanation of auto-zeroing is presented in the article entitled "Precise Biasing of Analog-to-Digital Converters by Means of Auto-Zero Feedback", *IEEE Journal of Solid State Circuits*, Vol. SC-17, No. 6, (Dec. 1982), pp. 1220–25, by J. C. Candy and B. A. Wooley.

Prior auto-zeroing circuits utilize an analog integrator to average the digital output and thereby provide a compensating voltage to the input of the limiting comparator. However, amplitude ripple occurs when the triangularly-shaped excursions, which appear at the integrator's output, are fed back and added to the input signal. The amplitude of the triangular waveform must be reduced so as to avoid distortion introduced by the integrating feedback circuit. In order to minimize this distortion, a large time constant is required, i.e., on the order of several seconds. Thus, the auto-zero circuit typically requires the use of a large off-chip integrating capacitor. For example, the prior art teaches the use of an external capacitor having a value of 0.1–0.2 microfarad, such that the maximum amplitude ripple is less than one-fifth LSB at 300 Hz. See, e.g., K. Yamakido et al., "A SingleChip CMOS Filter/CODEC", *IEEE Journal of Solid State Circuits*, Vol. SC-16, No. 4, (Aug. 1981), pp. 302–07.

The primary disadvantage of using known auto-zeroing techniques is the requirement of the large integration capacitor. A 0.1–0.2 microfarad capacitor cannot be readily integrated with the remaining circuitry in the A/D chip because its value is too large. Thus, an external auto-zero capacitor requires its own pinout from the integrated circuit. Furthermore, the use of additional off-chip components increases the size, cost, and failure rate of the circuit. In modern switched-capacitor integrated circuits, these disadvantages can be quite significant for many signal processing applications.

A need, therefore, exists to provide an improved method and means for compensating for the effect of DC offset voltages in A/D converters and similar circuits, without the requirement of external auto-zeroing capacitors.

SUMMARY OF THE INVENTION

Accordingly, it is an object of the present invention to provide an improved offset compensation technique for digital signal processing circuits, such as A/D converters, zero-crossing detectors, signal limiters, etc.

Another object of the present invention is to provide an improved auto-zero circuit configuration which does not require the use of external auto-zero capacitors, and thus can be fully integrated on the chip.

These and other objects are achieved by the present invention, which briefly described, is an improved auto-zero feedback control circuit for adjusting the input offset bias of many types of signal coders. The control circuit of the present invention utilizes a digital integration stage in the feedback loop to: (a) sample the limited signal at a sampling rate much higher than the frequency of the input signal; (b) keep a running count of the total number of positive and negative samples; and (c) determine when the accumulated total sample count exceeds a predetermined positive or negative overflow threshold. When the overflow occurs, the digital integration stage enables an analog integration stage to deliver a small quantity of charge (a "charge packet") to the integrating capacitor, which integrates the overflow charge packets to provide a bias control signal. This analog integrator output signal is then attenuated and applied to the limiting stage or filter stage to bias the input signal at the center of the limiter threshold. In this way, the integrating capacitor is intelligently charged at a slow rate, thus obviating the requirement for a large value external capacitor. Moreover, the limiter output is oversampled at a sufficient frequency, such that a precise duty cycle is maintained.

In the preferred embodiment, an up/down counter is used to perform the digital integration, and a switched capacitor integrator is used for the analog integration stage. An input filter stage and an input hysteresis circuit are also used. Utilizing the techniques of the present invention, an integrating capacitor having a value of 20 picofarad is sufficient to perform the auto-zeroing integration, while at the same time minimizing signal distortion due to amplitude ripple. This allows the circuit to achieve a 40 dB dynamic input range, and maintain an accurate duty cycle with less than a 1% duty cycle error.

BRIEF DESCRIPTION OF THE DRAWINGS

The features of the present invention which are believed to be novel are set forth with particularity in the appended claims. The invention, together with further objects and advantages thereof, may best be understood by reference to the following description, taken in conjunction with the accompanying drawings, in the several figures of which like-referenced numerals identify like elements, and in which:

DETAILED DESCRIPTION OF THE PREFERRED EMBODIMENT

Figure 1:
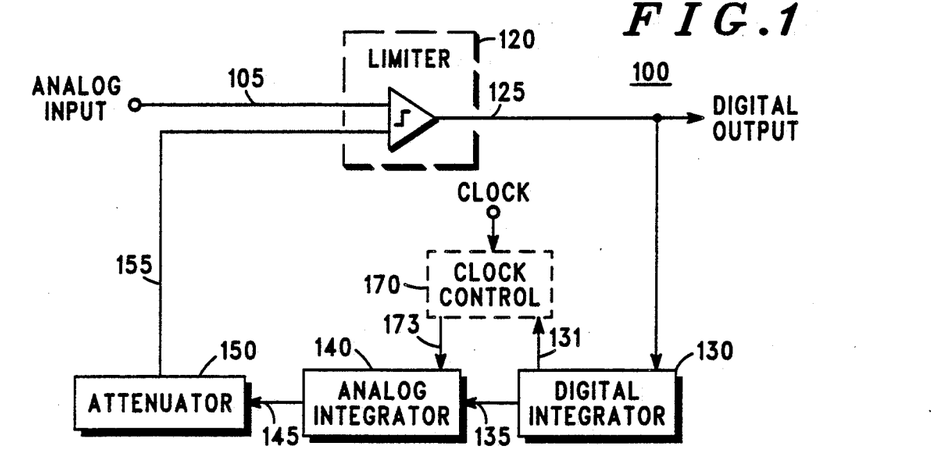
FIG. 1 is a general block diagram of a limiting stage utilizing the improved auto-zeroing feedback control circuit according to the present invention.

Referring now to FIG. 1, there is shown a block diagram of signal coder 100 having an auto-zero feedback circuit in accordance with the present invention. An analog input signal, typically at audio frequencies, is applied at input port 105 of limiter 120. Limiter 120 is typically a comparator, similar to a Motorola MC3302. However, the auto-zeroing technique of the present invention could also be used to correct for the offset of an amplifier stage. Therefore, limiter 120 could also be a high-gain operational amplifier. Accordingly, output 125 would be an analog signal, and digital integrator 130 would be replaced by an analog integrator.

The digital output at 125 is applied to the input of digital integrator 130. Integrator 130 performs the function of integrating the limited output signal much like an analog integrator, except that the requirement for a large integrating capacitor is thereby avoided. The digital integration stage performs three basic functions: (a) sampling the limited signal at a sampling rate much higher than the frequency of the input signal; (b) keeping a running count of the total number of positive and negative samples; and (c) determining when the accumulated total sample count exceeds a predetermined positive or negative overflow threshold. In other words, the digital integrator output corresponds to a digital representation of an analog integrator output, but essentially only the most significant bit (MSB) of the digital output is utilized in this application as an overflow indicator.

First, the digital integrator samples the limited signal at a sampling frequency $f_s$ which is much greater than the frequency $f_0$ of the input signal, e.g., 100 kHz sampling rate for a 1 kHz audio signal. This oversampling is necessary to preserve the zero-crossings of the input signal such that an accurate duty cycle may be maintained.

Next, the integrator accumulates the total number of positive and negative samples, i.e., counts up for positive samples and counts down for negative samples, maintaining a continuous sample count until a predetermined counter threshold is reached and an overflow occurs. The length of the counter, in conjunction with certain parameters of the succeeding analog integration stage, will determine the amount of amplitude ripple which will appear at the circuit's output. The amplitude ripple can be decreased as the counter length is increased. Typically, the autozero loop can have a time constant of several seconds. In order to settle the loop quickly upon power-up, a shortened counter length can be used to initiate the loop. After a specified time period, the loop can then be switched to its normal time constant.

When an overflow occurs, the digital integration stage enables the analog integration stage to deliver a small quantity of charge, i.e., a "charge packet", to the integrating capacitor. The digital integrator outputs the overflow indication to clock control block 170 via line 131, outputs the polarity of the overflow condition to analog integrator 140 via line 135, and resets its count to mid-range. Clock control 170 generates control signals at 173 which the analog integrator uses to supply a charge packet for the integrating capacitor. The operation of clock control 170 will be described in detail in conjunction with FIG. 2.

Analog integrator 140 converts the digital control signals into a charge packet whenever an overflow condition occurs. These charge packets are then applied to the integrating capacitor, which, in turn, is used to establish the bias for the limiter. At each overflow condition, either a positive or negative charge packet is applied to the integrating capacitor. The polarity control signal 135 determines whether a positive or negative charge is applied, and the overflow indication and its corresponding clock signals determine when to apply the charge packet. In other words, each time the digital integrator reaches an overflow condition, the analog integrator is clocked, such that a small quantity of charge of the correct polarity is delivered to the integrating capacitor. The polarity of the charge integrated is a function of whether a positive or negative overflow condition has occured. The quantity of charge is chosen large enough such that the difference between the absolute value of the two opposing charges is less than 2%. A 2% charge error translates into a 1% duty cycle error.

The voltage on the integrating capacitor, located in the analog integrator, is then applied as the bias control signal via line 145 and attentuator 150. The function of the attenuator is to reduce the magnitude of the bias change-per-charge packet update. Furthermore, the attenuator allows a smaller integrating capacitor to be used. The attentuated control signal is then applied by line 155 to a second input port of the limiter, i.e., the DC bias port of the limiter, which controls the input switching threshold. The auto-zero feedback loop works to center the input signal at the actual switching threshold of the limiter by adjusting the limiter bias voltage. Thus, if a DC offset existed such that the input signal was biased 10 mV above the switching threshold of limiter 120, the auto-zero feedback loop would increase the DC bias at 155 to raise the limiter switching threshold by 10 mV. Note, as will be explained later in FIG. 2, that the DC bias of the input signal, as opposed to the DC bias voltage of the limiter, is adjusted to center the input signal at the actual limiter switching threshold.

The use of the digital integrator in combination with the analog integrator allows the invention to realize an auto-zero offset cancellation circuit which can be completely integrated. If one were to try to achieve similar results by simply clocking the analog integrator at a fixed slower rate, the output duty cycle could deviate from 50/50 according to the following relation:

Duty cycle = $50(1 - 2f_o/f_s) / 50(1 + 2f_o/f_s)$, where $f_o$ and $f_s$ are the input frequency and the sampling frequency, respectively. Hence, slowly clocking the analog integrator would result in a poor duty cycle unless $f_s \gg f_o$.

Figure 2:
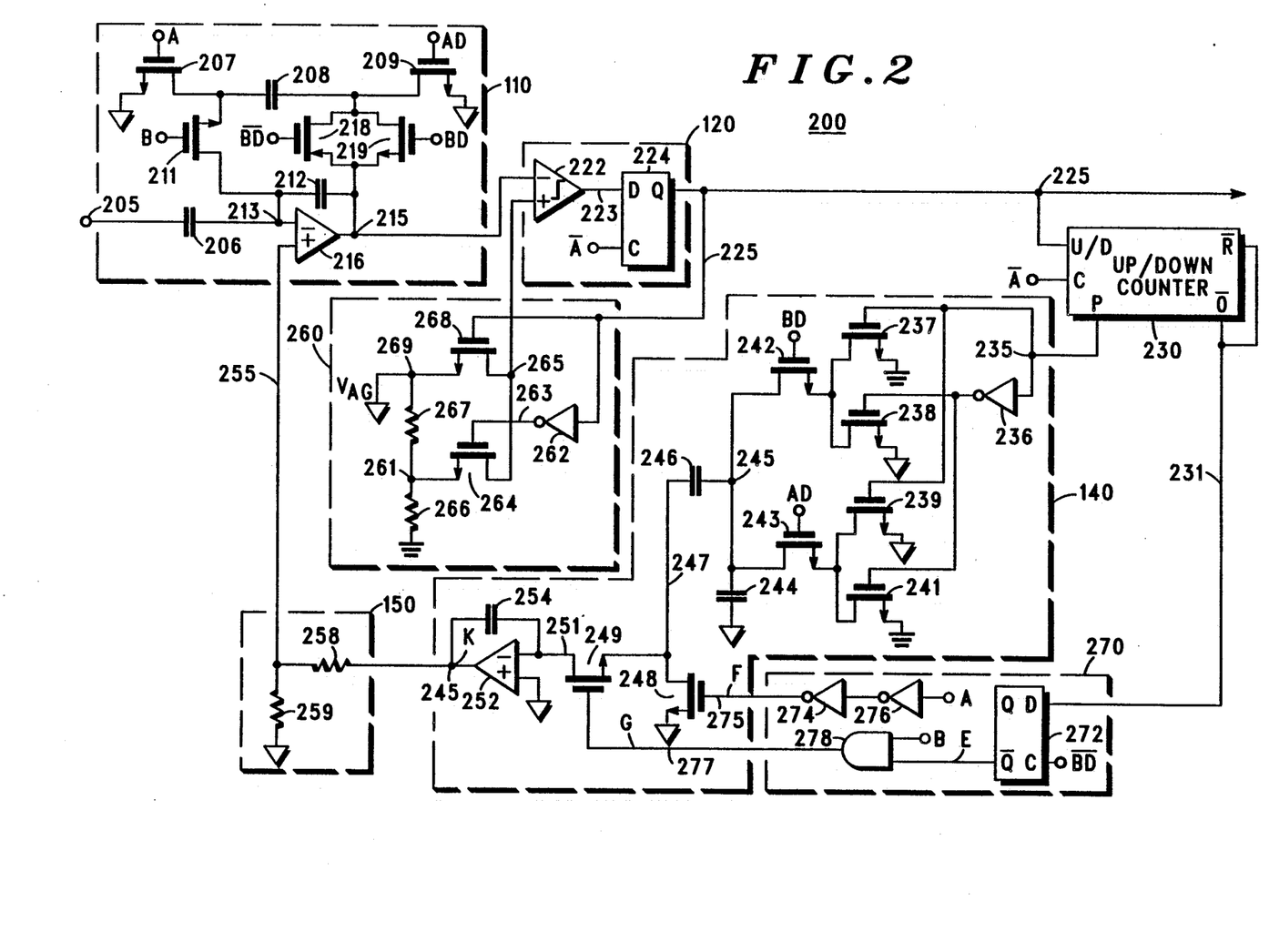
FIG. 2 is a detailed block diagram of a signal coder illustrating the auto-zeroing control circuit of the invention.

Referring now to FIG. 2, signal coder 200 is shown using the basic configuration of coder 100 of FIG. 1. An analog input signal is applied at terminal 205 of high pass filter 110. Filter 110 is configured as a standard switched capacitor high pass filter as known in the art. The gate of FET switch 207 is clocked using the first-phase clock signal A, while switches 211, 209, 218, and 219 are clocked using second-phase clock signal B, delayed first-phase clock signal AD, inverted delayed second-phase clock signal $\overline{BD}$, and second-phase clock signal BD, respectively. Although the high pass filter is not required, it can be used to remove DC offsets due to previous stages, and thus minimize the total DC offset that must be compensated for. Alternatively, a low pass filter could be used for other applications. However, in that case, the DC voltage offsets of previous stages must be compensated for in the auto-zero feedback loop.

In either case, the bias control voltage at 255 is applied to the positive input terminal of op amp 216. The op amp output at 215 is applied to limiter 120 at the negative input of comparator 222. The output of comparator 222 at 223 is applied to the input of D flip-flop 224. The flip-flop is clocked by inverted first-phase clock signal $\overline{A}$. The Q output at 225 is routed to up-/down counter 230 and provided as the digital output of the circuit.

The positive input of the comparator would normally be referenced to analog ground, indicated in the figure as $V_{AG}$. In the preferred embodiment, $V_{AG}$ is approximately ½ the supply voltage $V_{DD}$. Note, however, that hysteresis circuit 260 can provide the limiter with hysteresis such that the input switching threshold moves with the output. Hence, the Q output at 225 is also coupled to hysteresis circuit 260. When the Q output is high, hysteresis transistor 268 is turned on, such that the positive input terminal 265 of the comparator is coupled to $V_{AG}$ at 269. On the other hand, when the Q output is low, transistor 264 is turned on, such that input 265 is coupled to node 261. The voltage at node 261 is slightly below $V_{AG}$, as determined by the resistor divider network of resistors 266/267.

In the preferred embodiment, hysteresis circuit 260 is configured for use with a zero-crossing detection circuit. In this case, when either no signal or a small signal is present, the digital output oscillates at a harmlessly-low out-of-band frequency. The hysteresis serves to both enhance the circuit's noise immunity, and to prevent a carrier detect circuit located at the output from triggering on noisy or false low level input signals. With hysteresis, when no input signal is present, the output will oscillate at a frequency whose period equals twice the time it takes the attenuated bias control signal 255 to traverse the two threshold limits of comparator 222.

Some applications require a stationary output when either no signal or only a small signal is present. In this case, the output signal could still be derived by comparing the input signal to the same two voltage levels provided by hysteresis circuit 260 at 265. However, the input to digital integrator 130 would then be derived by comparing the input signal to a third voltage level centered between these two hysteresis voltage levels. This additional comparison could be readily accomplished by multiplexing the input to comparator 222.

Figure 4:
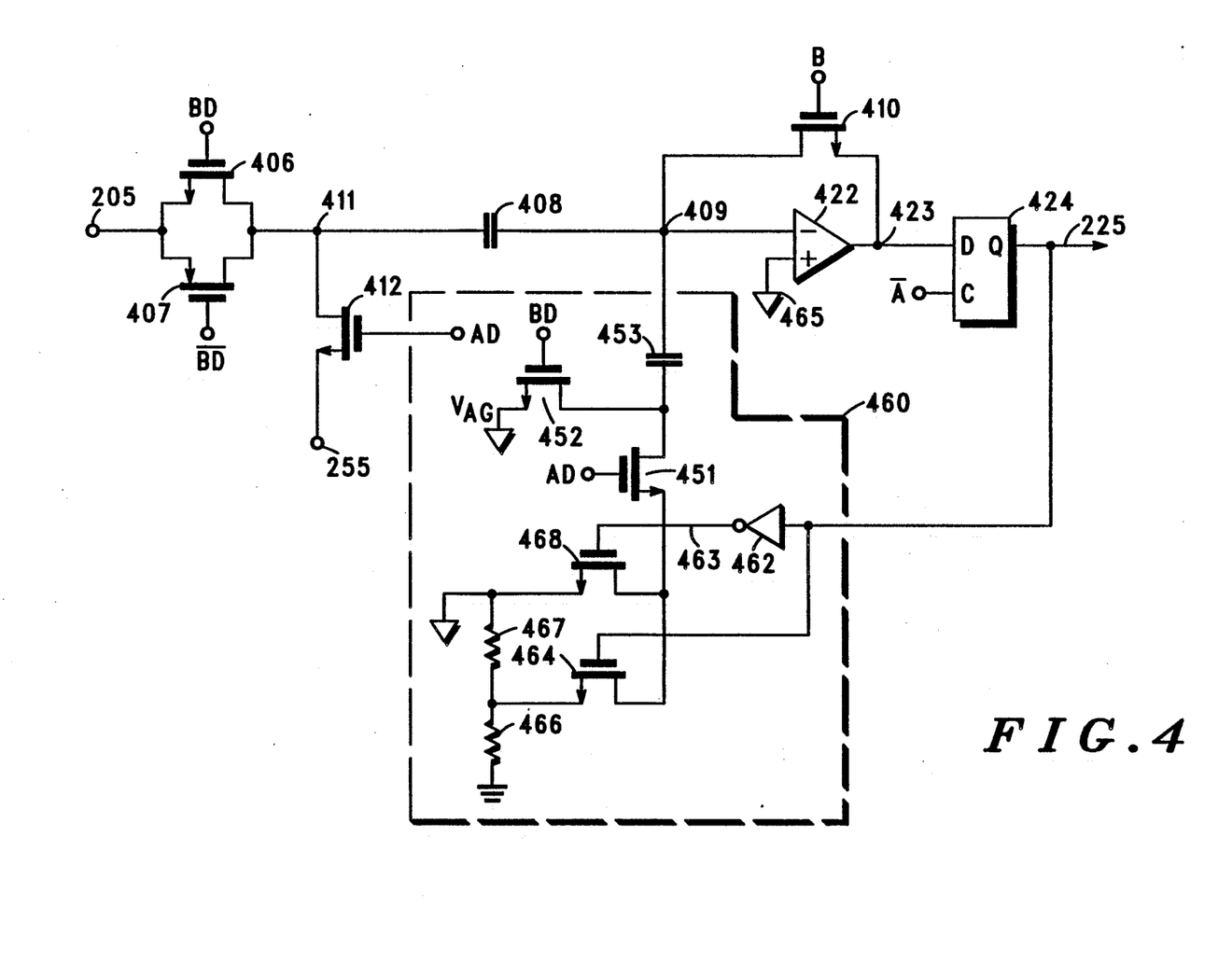
FIG. 4 is an alternate embodiment of the input stage of the signal coder of FIG. 2, without using an input filter.

An alternate embodiment of the input circuit is illustrated in FIG. 4. The circuit shown in FIG. 4 is "single-ended", i.e., unbalanced. However, the circuit can readily be translated into a fully differential circuit using techniques known in the art. In FIG. 4, no input filter stage is used, and comparator 222 of FIG. 2 is replaced with op amp 422. Here, the input signal at 205 is directly coupled via complementary switches 406 and 407 and capacitor 408 to the negative input terminal at 409 of op amp 422 during the delayed second-phase clock signal BD. Transistor 410 also couples output node 423 to input node 409 during second-phase clock signal B, such that op amp 422 is biased at its switching threshold. During the delayed first-phase clock signal AD, switches 406, 407, and 410 are turned off, and switch 412 is turned on, such that the bias control voltage at 255 is coupled to node 409 via switch 412 and capacitor 408. In this manner, the feedback path is completed, and the offset voltage is cancelled.

Hysteresis circuit 460 is constructed in a similar manner to that of hysteresis circuit 260 of FIG. 2. If hysteresis is not desired, circuit 460 can simply be removed.

Referring back to FIG. 2, digital integrator 230 is illustrated as an up/down counter. The up/down input U/D is coupled to digital output 225, to indicate which direction to count. The inverted first-phase clock signal $\overline{A}$, which is much faster than the highest frequency of the input signal applied at 205, is used to clock the counter. The samples are counted until the overflow threshold is reached, at which time the inverted overflow output $\overline{O}$ goes low at 231. This also causes a reset, since the overflow output $\overline{O}$ is tied to the reset input $\overline{R}$. The polarity P of the overflow is output at 235. This polarity signal will be high if a positive overflow occurred, and will be low if a negative overflow occurred.

Figure 3:
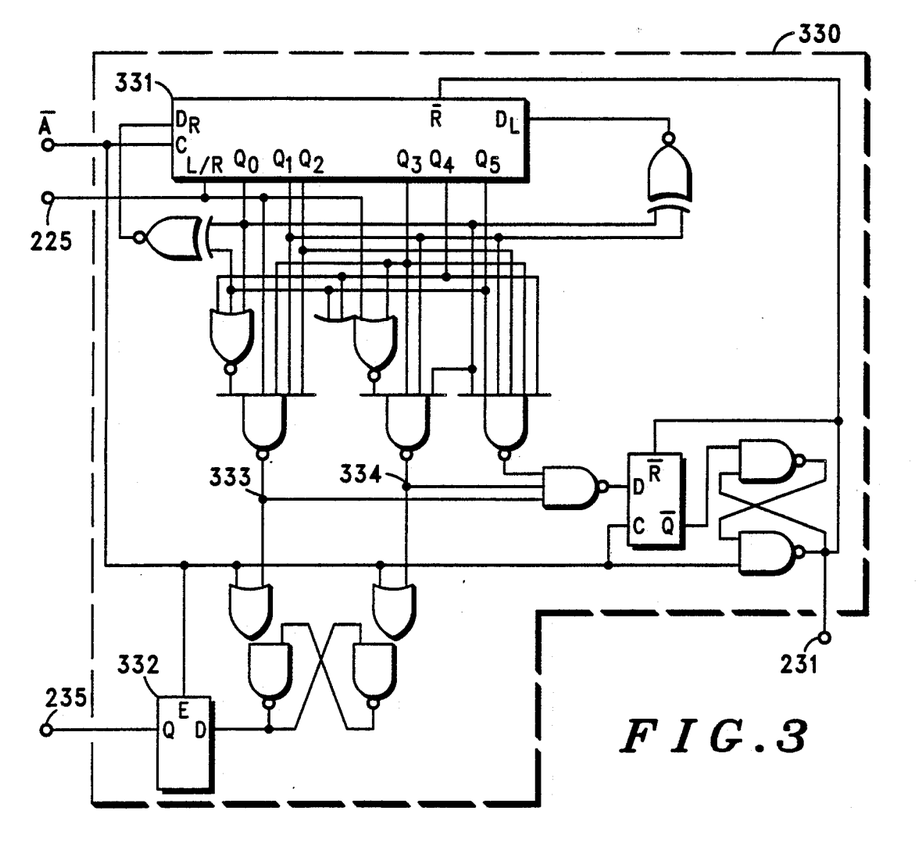
FIG. 3 is a schematic diagram of the up/down counter block of FIG. 2.

FIG. 3 is a schematic diagram of the preferred embodiment of up/down counter 230. Digital integrator 330, which can be fully integrated, comprises a maximal-length shift register counter which is well known in the art. The counter is clocked by inverted first-phase clock signal $\overline{A}$, and can be made to count backwards by reversing the shift register direction and feeding back the appropriate register taps as shown. The left/right L/R input to shift register 331, such as a Motorola MC14194B, is coupled to the signal coder's digital output 225 to indicate which direction to shift. Latch 332 provides the polarity output P at 235 based upon the direction of the counter overflow. The left and right shift register overflow limits are decoded and made available at nodes 333 and 334 respectively. When an overflow has occurred, the inverted overflow signal $\overline{O}$ is available at 231.

Again referring to FIG. 2, the overflow output at 231 is applied to clock control circuit 270. D-flip-flop 272, clocked by inverted delayed second-phase clock signal $\overline{BD}$, generates an enable output E to gate 278. This enable signal is then gated with clock signal B to generate control signal G at 277, which turns on transistor 249. Transistor 249 is used to control the charge packet coupling to the integration capacitor. Transistor 248, which is used to generate the charge packet, is controlled by control signal F at 275 derived from clock signal A as shown. The function of these logic elements and signals will be more fully understood in conjunction with the waveform description of FIG. 5 below.

The polarity output signal P of the digital integrator is applied to analog integrator 140. In the preferred embodiment, a switched capacitor integrator is used to charge or discharge integrating capacitor 254 using charge packets from capacitor 246. The switched capacitor integrator is clocked once each time the overflow condition is reached. At such time, clock control circuit 270 essentially provides a single clock cycle from the set of continuous switched capacitor clock waveforms A, AD, B, and BD, which are used to drive other switched capacitor circuits.

When the polarity signal P at 235 is high, transistors 237 and 239 are turned on. Hence, during clock phase A (when control signal F is high), transistor 243 and 248 are turned on such that capacitor 246 is discharged (i.e., both sides at $V_{AG}$), through transistors 248, 243, and 239. During the following clock phase B, and only after an overflow condition has occurred such that control signal G is high, node 245 of capacitor 246 is forced to ground via transistors 242 and 237, while node 247 of capacitor 246 is coupled to node 251 through transistor 249. Hence, capacitor 246 is charged to $V_{AG}$ through capacitor 254, op amp 252, and transistors 249, 242, and 237. In this manner, when the overflow polarity is positive, a positive charge packet is delivered to capacitor 254.

On the other hand, when the polarity output signal P of counter 230 is low, transistors 238 and 241 are turned on. Accordingly, during clock phase A, capacitor 246 is charged to $V_{AG}$, since node 247 of capacitor 246 is coupled to $V_{AG}$ through transistor 248, and node 245 of capacitor 246 is forced to ground via transistors 243 and 241. When control signal G goes high after an overflow condition has occurred, node 245 of the charged capacitor 246 is now forced to $V_{AG}$ via transistors 242 and 238, while node 247 is coupled to capacitor 254 and op amp 252 via transistor 249. In this way, capacitor 246 is discharged, and a negative charge packet is delivered to integrating capacitor 254.

Attenuator 150 is located after the analog integrator in order to reduce the size requirement of integrating capacitor 254. The amount of attenuation is selected according to the amount of offset cancellation required, i.e., by the magnitude of the offset voltage to be cancelled. The size of the integrating capacitor will be inversely proportional to the attenuation. Once the amount of attenuation has been determined, the integrating capacitor is chosen to establish the bias level change that would occur for each integrator clock cycle. In the preferred embodiment, resistors 258 and 259 form a divide-by 25 attenuation circuit. The attenuated control voltage is then applied to the positive input of filter 110 via line 255 to provide the auto-zero feedback for offset cancellation.

Note that in the preferred embodiment, the value of capacitor 246 is 0.03 picofarad, while the value of the integrated input voltage is 1.667 volts. Hence, only a small quantity of charge is delivered to integration capacitor 254 during each overflow condition. The quantity of charge is chosen to be large enough such that the difference between the absolute value of the two opposing charges is less than 2%, which translates into a 1% duty cycle error. The charge error results from both switch charge mismatch and any input offset which may exist in the integrating amplifier 252. The charge packet per overflow occurrence is equal to $0.03 \text{ pf} \times 1.667 \text{ volts} = 0.05 \times 10^{-12}$ Coulombs. Further, in the preferred embodiment, the value of integration capacitor 254 is 20 pf, and the value of the attenuation is 25. Therefore, the voltage change per overflow occurrence at the integrator output 245 is $0.05 \times 10^{-12} \text{C}/20 \text{ pf} = 2.5$ millivolts, and the voltage change at the attenuator output is 2.5 mV /25=0.1 mV or 100 microvolts.

Figure 5:
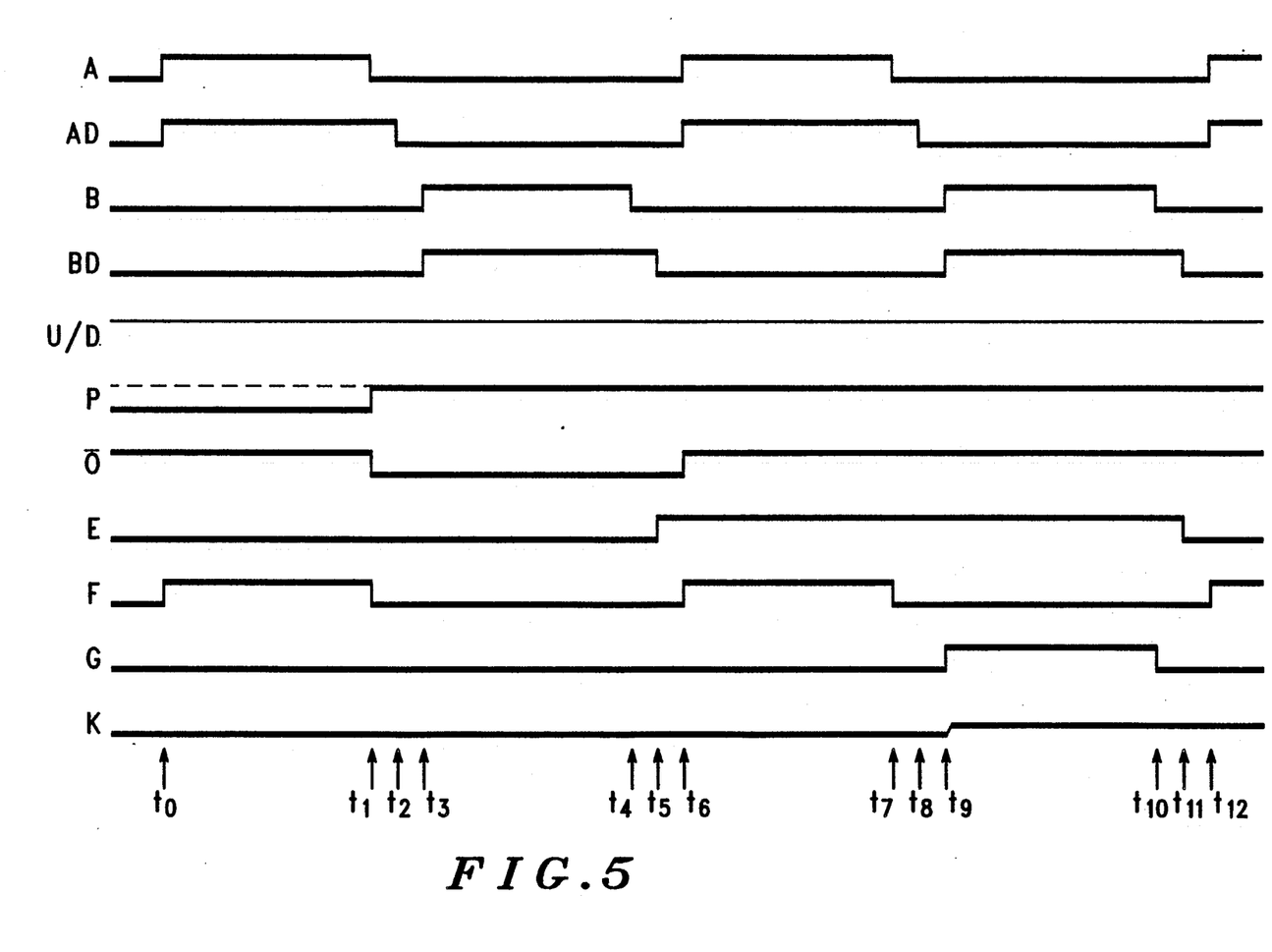
FIG. 5 represents various waveforms of the circuit of FIG. 2, illustrating clock timing and voltage level relationships.

Referring now to FIG. 5, the operation of coder 200 of FIG. 2 will now be explained using the waveforms illustrated. The upper four waveforms represent standard two-phase clock signals and their respective delayed signals. First-phase clock signal A, in the preferred embodiment, has a frequency of 100 kHz. Delayed clock signal AD goes high at the same instant of time $t_0$, but remains high for a slight turn-off delay of 50–150 nanoseconds, i.e., $t_1$–$t_2$. After another slight delay at time $t_3$, second-phase clock signal B goes high, and then goes low at time $t_4$. At time $t_5$, the delayed second-phase clock BD also goes low. The inverted versions of clock signals A, AD, B, BD, that is, $\overline{A}$, $\overline{AD}$, $\overline{B}$, $\overline{BD}$, respectively, are also used throughout the circuit, but have not been illustrated in FIG. 5.

Assuming that FIG. 5 represents a short period in time where the comparator input signal at node 215 is below its switching threshold, the digital output signal at 223 will be positive. Accordingly, the up/down counter input U/D at 225 would remain high for at least the two clock cycles shown in FIG. 5. Assuming also that U/D was high for a sufficient number of clock cycles to reach the counter threshold, the overflow output $\overline{O}$ will go (active) low at the end of the clock cycle A indicated at $t_1$. The polarity output P may also change at this instant of time, depending on its previous value. Overflow output $\overline{O}$ is reset to its normally high state at the beginning of the next A clock cycle, i.e., at $t_6$.

After an overflow condition has occurred, clock control flip-flop 272 utilizes inverted delayed clock $\overline{BD}$ to generate the enable signal E, which goes high at time $t_5$. This enables the analog integrator to apply a charge packet to the integrating capacitor. The enable signal E is AND'ed with clock signal B at 278 to generate control signal G, which goes high at $t_9$. To reduce charge errors induced by switches 248 and 249, control signal F is produced by simply buffering clock signal A through inverters 274 and 276. Charge errors are minimized if switches 248 and 249 are turned off rapidly with matched waveforms. Control signals F and G turn-off switch 248 and turn-on switch 249 such that the charge packet on capacitor 246 is applied to integrating capacitor 254. Hence, for the positive overflow condition shown in FIG. 5, the output of integrating amplifier 252, i.e., waveform K, increases by a minor amount at $t_9$ to change the bias level of the input signal. The enabled integrator clock cycle ends at time $t_{10}$.

When the sampling frequency $f_s$ is much greater than the input frequency $f_0$, the symmetry of the output signal is determined by the mismatch between the positive and negative charge packets delivered to integrating capacitor 254. As noted above, the magnitude of the charge is equivalent to the product of the value of capacitor 246 and the integrated input voltage $V_I$ at node 245. Many factors contribute to the output charge error. One way to minimize this charge error would be to use a large value for capacitor 246 and a higher voltage for $V_I$. However, if large values are used for capacitor 246 and input voltage $V_I$, correspondingly larger values of integration capacitor 254 and the counter length will be required to limit the level of distortion introduced from the auto-zero feedback. Therefore, it is important to minimize the charge error at its source. Several techniques may be used.

First of all, delayed clock signals are implemented to control switches 242 and 243. These delayed clocks AD and BD prevent switches 242 and 243 from introducing any charge error onto integrating capacitor 254.

Second, matched single-transistor switches are used for transistors 248 and 249 such that they can cancel each other's charge injected into the summing junction 251. In other words, when switch 249 opens, a fraction of the channel charge of switch 249 will flow into node 247. Zero charge injection occurs only if this same fraction of charge is present at node 247 when switch 249 closes. However, while switch 249 is open, switch 248 is closed and opened. When switch 248 closes, any charge present at node 247 is removed through switch 248 and shunted to $V_{AG}$. When control signal F goes low, switch 248 is opened. Zero charge injection is achieved if switch 248 leaves the same charge quantity at node 247 as that which was left by the opening of switch 249. These charge quantities can be matched within 2% if both switches are turned-off rapidly with matched waveforms, if both switches are made to look into the same AC impedance at node 247, and if the AC impedance at the summing junction 251 is made to appear similar to analog ground $V_{AG}$.

Charge error can also be produced when the parasitic capacitance at node 247 is switched between analog ground and the voltage at summing junction 251. This summing junction voltage is offset from analog ground by the amplifier input offset voltage. A sufficiently low charge mismatch is achieved by minimizing the switch layout parasitics at node 247, and by reducing the amplifier input offset through common centroid layout practices.

The input offset voltage of integrating amplifier 252 causes an additional charge imbalance, since node 247 of capacitor 246 is also switched from analog ground to the offset virtual ground of amplifier 252. This imbalance is controlled by making the input voltage imposed at node 245 of capacitor 246 significantly greater than the offset voltage of amplifier 252.

With all charge error reducing mechanisms in place, the value of capacitor 246 is chosen to obtain a specified output symmetry. Assuming that $f_s$ is much greater than $f_0$ and neglecting the duty cycle error due to sampling, a duty cycle error of less than 1% can be achieved.

In review, an improved method and means for adjusting the input bias offset of a limiter circuit has been shown. The limiter output is digitally integrated to provide a first control signal indicative of the time when the integrated output signal exceeds a predetermined positive or negative threshold. A second control signal is provided to indicate which threshold was exceeded. This second control signal is then applied to an analog integrator in response to the first control signal, thereby generating the bias control voltage indicative of the integrated value of the second control signal. The bias control signal is applied to an input port of the limiter such that the limiter input offset is adjusted.

While only particular embodiments of the invention have been shown and described herein, it will be obvious that further modifications may be made without departing from the invention in its broader aspects. For example, it is contemplated that the improved auto-zero circuit configuration utilizing a digital integrator feeding an analog integrator could also be used in a feed-forward mode. Moreover, any type of circuit having voltage offsets may employ the techniques described herein. Accordingly, the claims are intended to cover all such changes and alternative constructions that fall within the true scope and spirit of the invention.

What is claimed is:

1. A means for biasing an amplifier having an analog input signal, an amplified output signal, and a bias control port for adjusting the DC bias of the output signal, said biasing means comprising:

first means for integrating said amplified output signal, and for producing a first control signal indicative of the time when the integrated output signal exceeds a predetermined positive or negative threshold, and for producing a second control signal indicative of the polarity of the threshold exceeded;

second means for integrating said second control signal in response to said first control signal, thereby providing a third control signal; and means for coupling said third control signal to said bias control port.

2. The biasing means according to claim 1, wherein said amplified output signal is a square wave having approximate symmetry.

3. The biasing means according to claim 1, wherein said second integrating means includes an integrating capacitor, and further includes means for applying a positive or negative charge quantity to said capacitor only during the time when the integrated output signal exceeds said predetermined positive or negative thresholds.

4. The biasing means according to claim 3, wherein said analog input signal has a frequency of less than 1 MegaHertz, and wherein said integrating capacitor has a value of less than 1000 picofarad.

5. The biasing means according to claim 1, wherein said coupling means includes means for attenuating said third control signal, thereby providing an attenuated integration signal to said bias control port.

6. An auto-zeroing circuit for compensating for the DC offset voltages of a signal limiting circuit having an analog input signal, a limited output signal, and a means for centering the analog input signal at the actual switching threshold of the signal limiting circuit in response to a bias control signal, said auto-zeroing circuit comprising:

first means for integrating said limited output signal, for providing a first control signal indicative of the time when the integrated output signal meets a predetermined integration threshold above or below a given reference point, and for providing a second control signal indicative of which integration threshold was met;

second means for integrating said second control signal in response to said first control signal, thereby producing said bias control signal.

7. The auto-zeroing circuit according to claim 6, wherein said centering means includes means for controlling the input switching threshold of said signal limiting circuit in response to said bias control signal.

8. The auto-zeroing circuit according to claim 6, wherein said centering means includes means for controlling the average DC level of said analog input signal in response to said bias control signal.

9. The auto-zeroing circuit according to claim 8, wherein said means for controlling the average DC level of said analog input signal includes an active filter.

10. The auto-zeroing circuit according to claim 6, wherein said first integrating means is a digital integrator having means for sampling said limited output signal, and means for accumulating the total number of samples.

11. The auto-zeroing circuit according to claim 6, wherein said first integrating means includes an up/down counter, wherein said first control signal represents the overflow output of said counter, and wherein said second control signal represents the polarity of the overflow output of said counter.

12. The auto-zeroing circuit according to claim 6, wherein said second integrating means includes a switched capacitor integrator circuit having its integrating input coupled to said second control signal, and having its clocking input coupled to said first control signal.

13. The auto-zeroing circuit according to claim 6, wherein the entire auto-zeroing circuit is constructed on an integrated circuit using switched capacitors, and wherein no capacitors external to said integrated circuit are required for DC offset compensation.

14. An analog-to-digital signal coder having feedback for adjusting the input offset bias of the coder, said signal coder comprising:

means for limiting an analog input signal, thereby providing a limited output signal, said limiting means including means for centering the analog input signal at the actual switching threshold of the limiting means in response to a bias control signal;

means for sampling at least a portion of said limited output signal, and for determining the relative polarity of each of the samples;

means for accumulating the total number of positive and negative samples;

threshold means for determining when the accumulated total number of samples exceeds predetermined positive and negative overflow thresholds, thereby providing positive and negative overflow indications, respectively;

means for generating positive and negative charge quantities in response to said positive and negative overflow indications, respectively;

means for integrating said positive and negative charge quantities to provide a feedback control signal; and means for coupling said feedback control signal to said bias control signal.

15. The analog-to-digital signal coder according to claim 14, wherein said centering means includes means for adjusting the input switching threshold of said limiting means in response to said bias control signal.

16. The analog-to-digital signal coder according to claim 14, wherein said centering means includes means for adjusting the DC bias level of said analog input signal in response to said bias control signal.

17. The analog-to-digital signal coder according to claim 14, wherein said limiting means further includes means for filtering said analog input signal.

18. The analog-to-digital signal coder according to claim 14, wherein said threshold means includes means for resetting the total number of samples accumulated by said accumulating means upon the occurrence of any overflow indication.

19. The analog-to-digital signal coder according to claim 14, wherein said sampling means samples the sign bit output of said analog-to-digital signal coder.

20. The analog-to-digital signal coder according to claim 14, wherein said sampling means and said accumulating means comprise a digital integrator.

21. The analog-to-digital signal coder according to claim 20, wherein said digital integrator is an up/down counter circuit.

22. The analog-to-digital signal coder according to claim 14, wherein said charge quantity generating means includes switched capacitor circuitry which provides a positive charge packet upon each positive overflow indication, and which provides a negative charge packet upon each negative overflow indication.

23. The analog-to-digital signal coder according to claim 14, wherein said analog input signal is substantially symmetrical and exhibits a frequency of less than 100 kiloHertz, and wherein said integrating means includes an integrating capacitor having a value less than 100 picofarad.

24. The analog-to-digital signal coder according to claim 14, wherein said coupling means includes means for attenuating said feedback control signal, thereby providing an attenuated integration signal as said bias control signal.

25. A method of centering the input signal of an analog-to-digital (A/D) converter circuit within a given input signal range in response to a bias control signal, said method comprising the steps of:

(a) integrating at least a portion of the digital output signal of said A/D converter to provide an integrated output signal;

(b) determining the time at which said integrated output signal exceeds a predetermined positive or negative integration threshold, thereby providing an overflow signal;

(c) determining the polarity of the threshold which was exceeded, thereby providing a polarity signal; and (d) controlling the level of said bias control signal in response to said overflow signal and said polarity signal, such that the analog input signal remains centered within the given input signal range of said A/D converter.

26. The method according to claim 25, wherein said portion of the digital output signal includes the sign bit of the output signal.

27. The method according to claim 25, wherein said bias control signal adjusts the input switching threshold of a limiter device included within said A/D converter.

28. The method according to claim 25, wherein said bias control signal adjusts the average DC level of the analog input signal to said A/D converter.

29. The method according to claim 25, wherein said integrating step is performed digitally by sampling the sign bit of the digital output signal and accumulating the total number of samples, and wherein said time determining step is performed by comparing the accumulated sample number to a predetermined sample count.

30. The method according to claim 25, wherein said controlling step comprises the steps of:
generating charge quantities upon the occurrence of each overflow signal, said charge quantities having a polarity determined in response to the value of said integrated output signal; and
integrating said charge quantities using an integrating capacitor to provide said bias signal.

31. The method according to claim 25, wherein the analog input signal to said A/D converter is substantially symmetrical and exhibits a frequency of less than 1 MegaHertz, and wherein said integrating capacitor has a value less than 1000 picofarad.

32. The method according to claim 25, wherein said controlling step includes the step of attenuating said bias control signal before applying it to said A/D converter.

33. A method according to claim 25 wherein said bias control signal is an analog bias control signal and wherein said controlling step controls the level of said analog bias control signal.

34. A method according to claim 25 wherein said controlling step for controlling the level of said bias control signal includes the step of integrating said polarity signal and utilizing said integrated polarity signal to determine said bias control signal.

35. A circuit for determining the DC level of an input signal, said circuit comprising:
first means for integrating said input signal and for producing a first control signal indicative of the time when the integrated signal exceeds a predetermined positive or negative threshold, and for producing a second control signal indicative of the polarity of the threshold exceeded; and
second means for integrating said second control signal in response to said first control signal and utilizing said integrated second control signal to produce an output signal whose value is representative of the DC level of said input signal.

36. The circuit according to claim 35 wherein said second integrating means includes an integrating capacitor, and further includes means for applying a positive or negative charge quantity to said capacitor only during the time when the integrated input signal exceeds said predetermined positive or negative thresholds.

* * * * *